(12) United States Patent
Gammie

(10) Patent No.: US 10,199,919 B2
(45) Date of Patent: Feb. 5, 2019

(54) ZERO DEAD TIME CONTROL CIRCUIT

(71) Applicant: Microchip Technology Incorporated, Chandler, AZ (US)

(72) Inventor: David Gammie, Chandler, AZ (US)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 15/960,930

(22) Filed: Apr. 24, 2018

(65) Prior Publication Data

US 2018/0323696 A1    Nov. 8, 2018

Related U.S. Application Data

(60) Provisional application No. 62/500,744, filed on May 3, 2017.

(51) Int. Cl.
| | |
|---|---|
| *H02M 1/38* | (2007.01) |
| *H02M 3/158* | (2006.01) |
| *H02M 1/088* | (2006.01) |
| *H03K 17/567* | (2006.01) |
| *H03K 5/24* | (2006.01) |
| *H02M 3/157* | (2006.01) |
| *H02M 3/156* | (2006.01) |

(Continued)

(52) U.S. Cl.
CPC ............ *H02M 1/088* (2013.01); *G05F 1/24* (2013.01); *H02M 1/38* (2013.01); *H02M 3/156* (2013.01); *H02M 3/157* (2013.01); *H02M 3/158* (2013.01); *H03K 5/24* (2013.01); *H03K 17/567* (2013.01); *H02M 3/1588* (2013.01); *H02M 2001/0025* (2013.01); *H02M 2001/0048* (2013.01); *H02M 2001/385* (2013.01); *H03K 2217/0063* (2013.01); *H03K 2217/0072* (2013.01)

(58) Field of Classification Search
CPC ......... G05F 1/24; H02M 3/156; H02M 3/157; H02M 3/158; H02M 3/1588; H02M 2001/0025; H02M 2001/385; H02M 1/38
See application file for complete search history.

(56) References Cited

U.S. PATENT DOCUMENTS

| | | | | |
|---|---|---|---|---|
| 7,372,241 B1 * | 5/2008 | Tomiyoshi | .......... | H02M 3/1588 323/224 |
| 8,947,058 B2 * | 2/2015 | Ozasa | .................... | G03G 15/80 323/271 |

(Continued)

*Primary Examiner* — Timothy J Dole
*Assistant Examiner* — Ishrat Jamali
(74) *Attorney, Agent, or Firm* — Burr & Forman LLP; Ryan M. Corbett

(57) ABSTRACT

A circuit and method for controlling a power converter having a high-side and a low-side switch are provided. The circuit may include a comparator configured to receive a reference voltage at a first input and a ramp voltage at a second output, and to output a delay signal based on a comparison of the reference voltage and the ramp voltage. The delay signal may be configured to turn on one or more of the high-side switch and the low-side switch. The circuit may increase or decrease the reference voltage based on a dead time, which equals an amount of time when the high-side switch and the low-side switch are turned off. The circuit may include a first switch that is controlled to lower the reference voltage if a dead time exceeds a first threshold, and a second switch that is controlled to raise the reference voltage if the dead time delay signal is below a second threshold.

17 Claims, 6 Drawing Sheets

(51) Int. Cl.
    *G05F 1/24*     (2006.01)
    *H02M 1/00*     (2006.01)

(56) References Cited

U.S. PATENT DOCUMENTS

2016/0118911 A1*   4/2016   Huang .............. H02M 7/53871
                                                  363/132
2017/0012526 A1*   1/2017   Chen ....................... H02M 1/38

* cited by examiner

ZERO DEAD TIME CONTROL CIRCUIT

CROSS-REFERENCE TO RELATED APPLICATION

This application claims the benefit of U.S. Provisional Patent Application No. 62/500,744, filed on May 3, 2017, which is incorporated herein by reference in its entirety.

TECHNICAL FIELD

The present disclosure generally relates to a zero dead time controller for use in switching power converters.

SUMMARY

In switching power converters, such as the synchronous buck converter shown in FIG. 1, there is a concern that the high-side switch Q1 and the low-side switch Q2 may be on at the same time, which would result in a large instantaneous amount of current flowing through both switches Q1 and Q2. FIG. 2 illustrates this scenario, with arrows indicating the large current 'I' flows through the high-side switch Q1 and the low-side switch Q2. Such a large instantaneous current flowing from the voltage supply $V_{IN}$ to Ground may result in a loss of power and efficiency, and could possibly destroy the devices.

In order to prevent this instantaneous current flow, or "shoot-through," a pre-programmed delay can be used to create a "dead time," during which both switches are turned off. Alternatively, an adaptive timing circuit may be used, in which it is verified that the high-side switch Q1 is turned off before the low-side switch Q2 may turn on, and vice versa. FIG. 3 shows an example of an adaptive gate drive that ensures switches Q1 and Q2 are not turned on at the same time.

Although using a delay can help prevent shoot-through currents, it also creates dead time during which both the high-side switch Q1 and the low-side switch Q2 are turned off. Referring to FIG. 1, if the inductor L1 has been conducting current, then during the dead time, the inductor L1 must also continue to conduct current. But because both switches Q1 and Q2 are turned off during the dead time, the only conduction path is through the diodes. Because there is a larger voltage drop across the diodes than across the switches, the current passing through the diodes causes inefficiencies and losses. For example, there is a loss of power, as well as a charge loss with the reverse recovery of the diode. As converters progress towards faster switching speeds, dead time is a substantial concern with respect to usability and efficiency. Therefore, a solution is needed whereby shoot-through currents are prevented, but dead times are limited or avoided.

FIG. 4 shows several waveform diagrams showing the high-side switch signal and the low-side switch signal. Waveform (a) shows the high-side switch signal HS, waveform (b) shows the low-side switch signal LS, and waveform (c) shows the high-side switch signal HS and the low-side switch signal LS superimposed. Referring to waveform (c), the high-side switch signal and the low-side switch signal alternate turning on and off, with the gaps in between the "on" states representing the dead time DT where neither switch is turned on.

According to an aspect of one or more exemplary embodiments, there is provided a control circuit that substantially produces waveform (d), in which the dead time DT is nearly zero. According to one or more exemplary embodiments, in order to achieve near-zero dead time, there is room to create a negative dead time, which could cause overlapping "on" states that result in shoot-through current. Through feedback, however, is designed to prevent this overlap from occurring, but a negative time potential value is achievable to create a zero dead time. According to an exemplary embodiment, a small phase delay, i.e., overlap, may be set, and then a larger amount of dead time may be added to negate this overlap. This dead time is subsequently decremented until the net result is an almost zero dead time. As the dead time approaches zero, in concert the decrementing value asymptotically reduces to a value based on the feedback of the system.

DETAILED DESCRIPTION OF EXEMPLARY EMBODIMENTS

Figure 1:
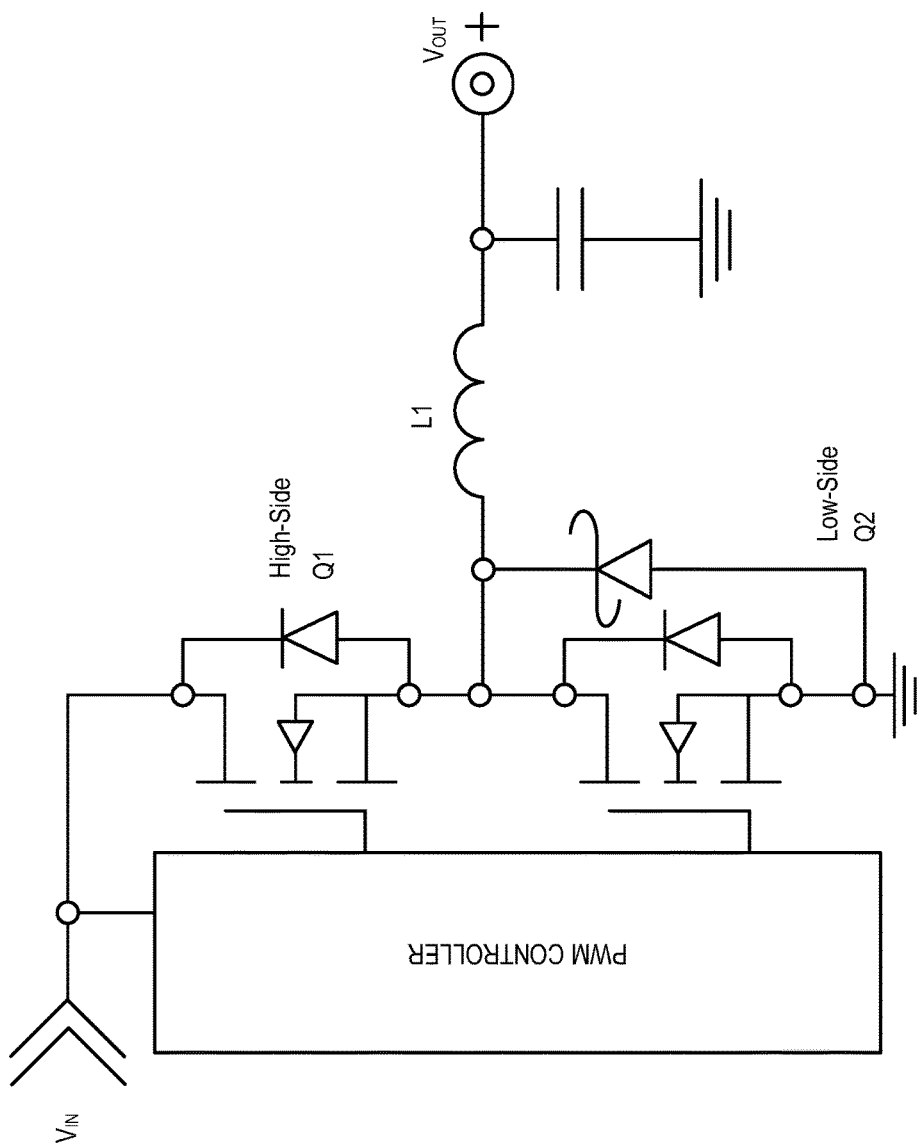
FIG. 1 illustrates a synchronous buck converter according to the related art.
Figure 2:
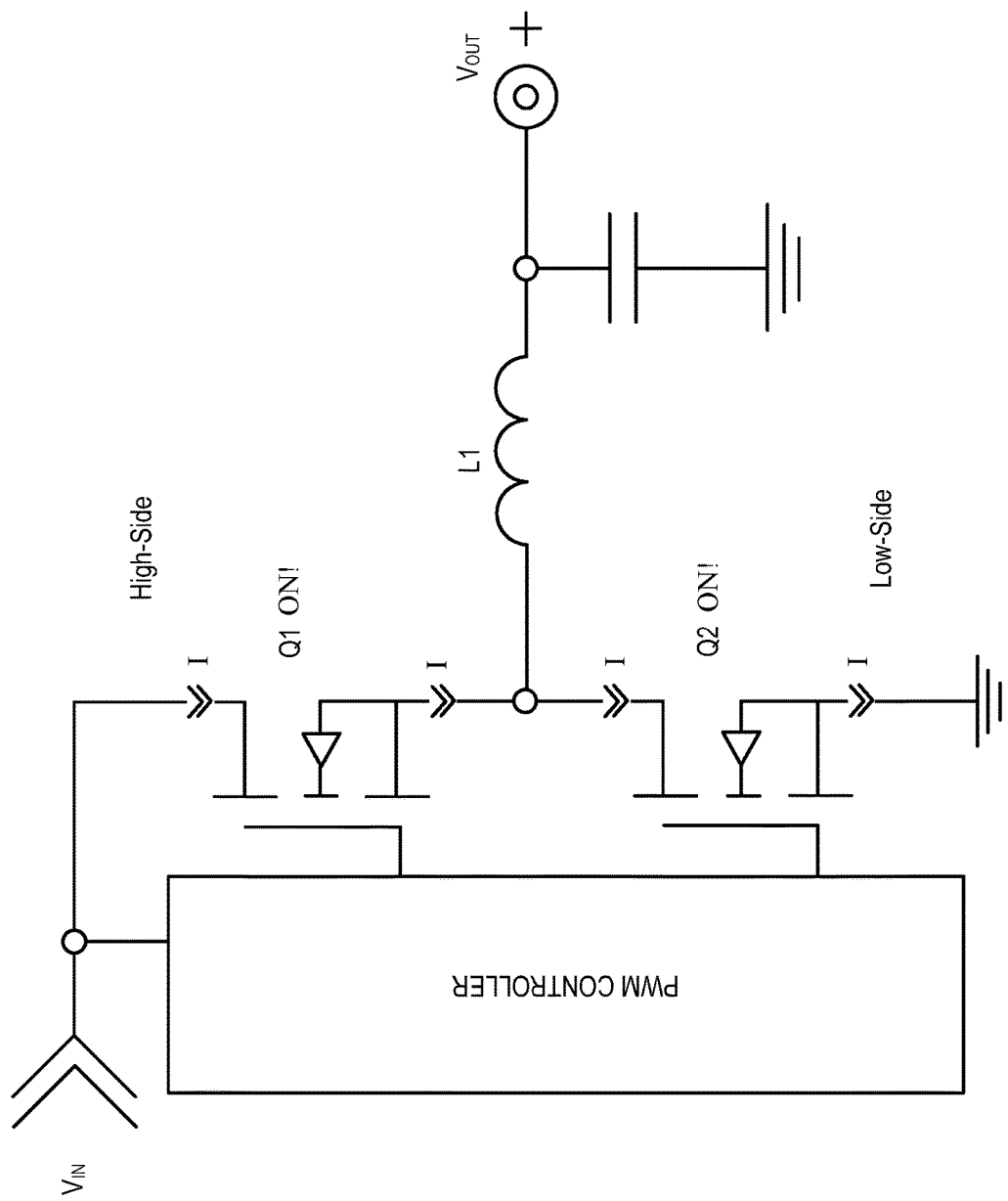
FIG. 2 illustrates a synchronous buck converter according to the related art with both high-side and low-side switches conducting.
Figure 3:
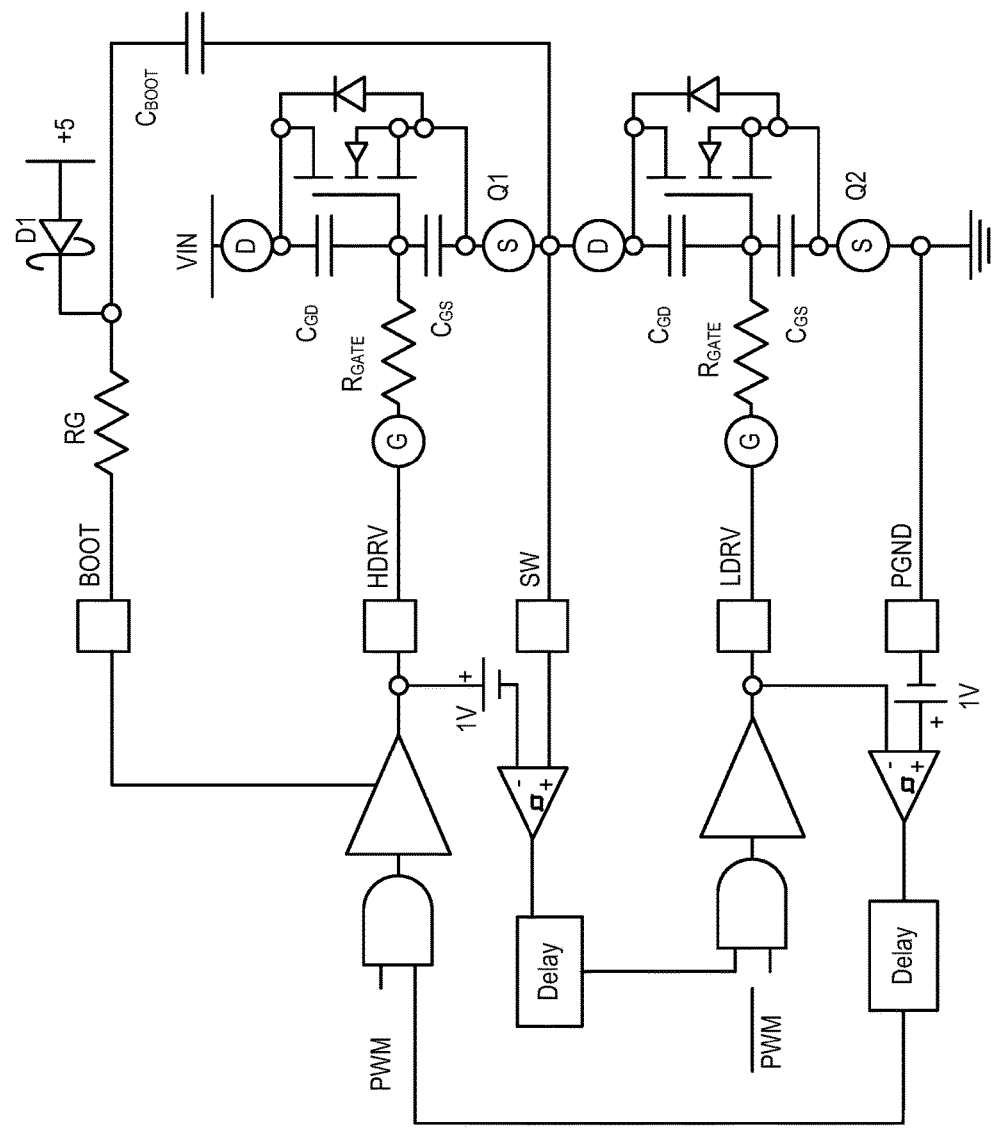
FIG. 3 illustrates an adaptive gate drive circuit according to the related art.
Figure 4:
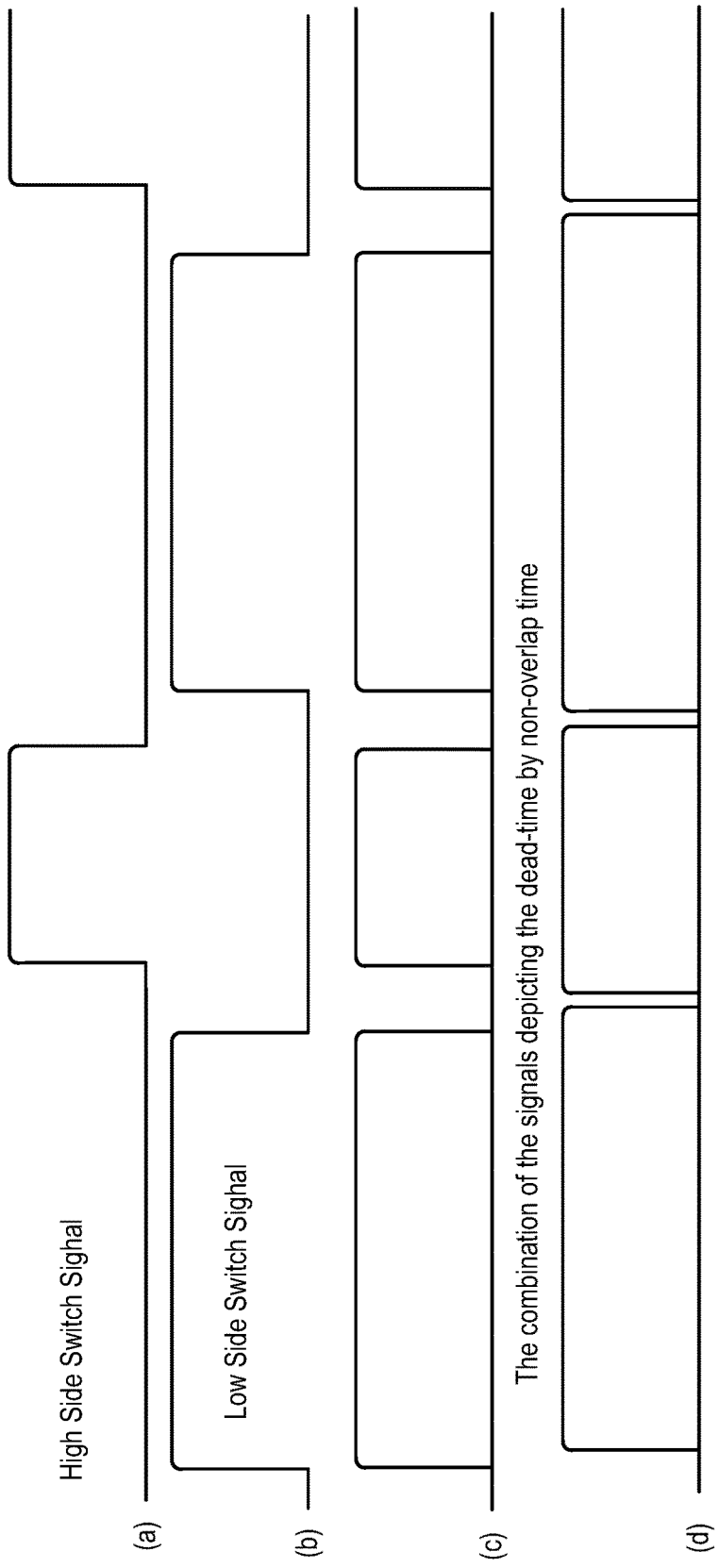
FIG. 4 illustrates waveforms of high-side switch signals and low-side switch signals according to the related art, and according to one or more exemplary embodiments.

Reference will now be made in detail to the following exemplary embodiments, which are illustrated in the accompanying drawings, wherein like reference numerals refer to like elements throughout. The exemplary embodiments may be embodied in various forms without being limited to the exemplary embodiments set forth herein. Descriptions of well-known parts are omitted for clarity.

Figure 5:
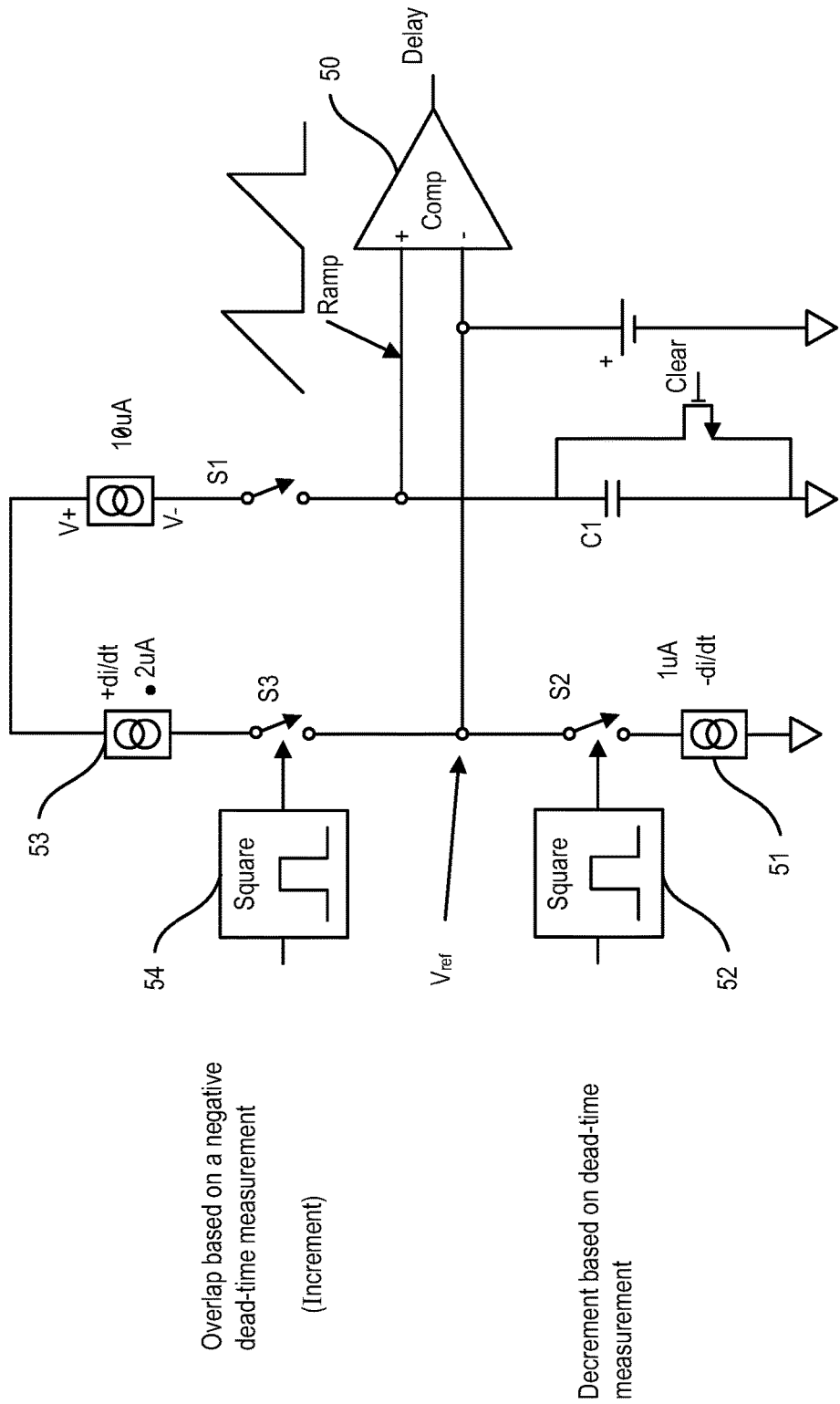
FIG. 5 illustrates a circuit according to an exemplary embodiment.

FIG. 5 illustrates an exemplary embodiment of the present disclosure for reducing the dead time between low-side and high-side switch signals. According to the exemplary embodiment, a dynamic or changing reference voltage $V_{ref}$ is input to the negative input of a comparator 50, and a ramp signal $V_{ramp}$ is input to the positive terminal of the comparator 50. The ramp signal may have a fixed period. The comparator outputs a delay signal based on the duration in time for the $V_{ramp}$ signal to reach the reference voltage $V_{ref}$, which creates an addition to the dead time. More specifically, the output delay signal when ANDed directly with the turn on signal may be used to control amount of delay the gate signal of one or more high side switch and low side switch, which affects the amount of dead time between the "on" states of the high side switch and low side switch. According to an exemplary embodiment, one of the circuits shown in FIG. 5 may be provided for each of the low-side switch and the high-side switch. This dynamically changing reference voltage $V_{ref}$ may be set at a high startup value, in order to initially set the default dead time at a large value. This ensures that the high-side switch and the low-side switch are not simultaneously on at startup.

The dead time is then measured, and switch S2 is controlled based on the measured dead time. For example, the dead time may be measured by measuring the gate voltages of the high-side switch and low-side switch, and the voltage of a switch node between the high-side switch and the low-side switch. If the measured dead time exceeds a set threshold, the switch S2 is closed, which causes a pulsed decrementing current of the same time duration as the dead time to pull charge away from the $V_{ref}$ capacitor (not shown) thus lowering the reference voltage $V_{ref}$. For example, a first time-based current source 51 may decrement the referenced voltage $V_{ref}$ when switch S2 is closed. The switch S2 may be controlled by an input signal 52 which closes the switch S2 for a period of time based on the measured dead time and the rate at which the first time-based current source 51 decrements the reference voltage $V_{ref}$.

Figure 6:
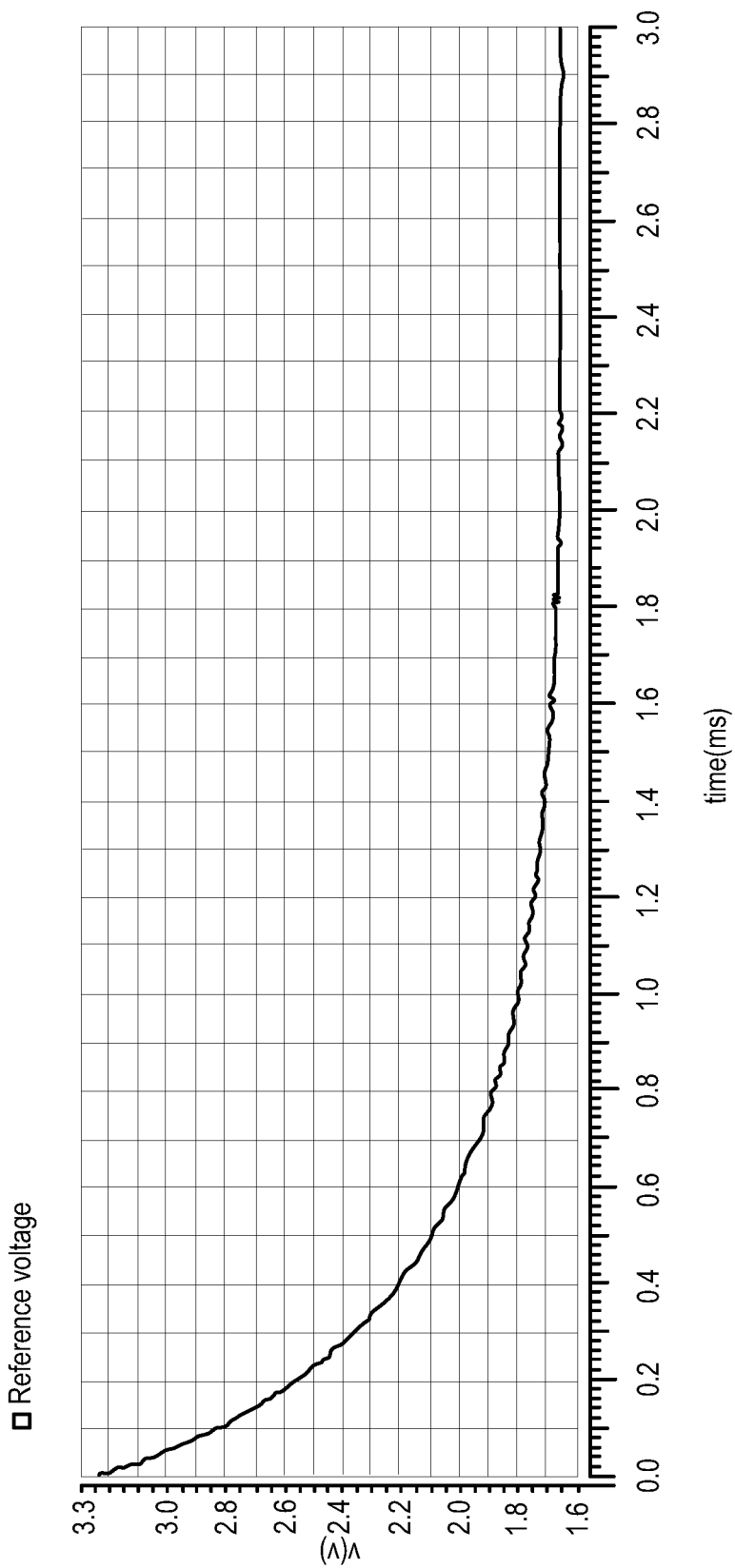
FIG. 6 illustrates a waveform of the reference voltage of the circuit according to FIG. 5.

The lower reference voltage is then input to the comparator 50, which outputs a decreased delay corresponding to the decreased reference voltage $V_{ref}$. With each subsequent dead time, the dead time is slowly reduced by lowering the reference voltage. As the dead time decreases so does the amount of time the pulsed current is decrementing until it reaches a vanishing point of a near near-zero overlap or near-zero dead time has been achieved. As shown in FIG. 6, the reference voltage $V_{ref}$ starts at a relatively large value, and is slowly decremented until a constant reference voltage is reached. More specifically, in the exemplary embodiment of FIG. 6, the reference voltage $V_{ref}$ is initially approximately 3.3V, but decreases until it reaches a relatively constant reference voltage of approximately 1.7V. However, the initial and constant reference voltages, and the rate of change thereof, shown in FIG. 6 are merely exemplary, and these values may vary. The values are determined by the feedback of the system.

In order to prevent negative overlap, the overlap of the high-side switch and low-side switch is measured, and is used to control the switch S3. For example, the overlap may be measured by measuring the gate voltages of the high-side switch and low-side switch, and the voltage of a switch node between the high-side switch and the low-side switch. Alternatively, the dead time may be measured and compared to a threshold value to determine if the dead time is less than the threshold value. If the measured overlap becomes too large, or the dead time becomes too short, the switch S3 closes, which causes a pulsed incrementing current that charges the $V_{ref}$ capacitor and raises the reference voltage, and thereby increase the delay or dead time. For example, a second time-based current source 53 may increment the reference voltage $V_{ref}$ when switch S3 is closed. The switch S3 may be controlled by an input signal 54 which closes the switch S3 for a period of time based on the measured overlap and the rate at which the second time-based current source 53 increments the reference voltage $V_{ref}$. By preventing the dead time from becoming too low, or negative, shoot-through current that may damage the device may be prevented.

Although the inventive concepts of the present disclosure have been described and illustrated with respect to exemplary embodiments thereof, it is not limited to the exemplary embodiments disclosed herein and modifications may be made therein without departing from the scope of the inventive concepts.

What is claimed is:

1. A circuit for controlling a power converter having a high-side switch and a low-side switch, the circuit comprising:
    a comparator configured to receive a reference voltage at a first input and a ramp voltage at a second output, and to output a delay signal based on a comparison of the reference voltage and the ramp voltage, said delay signal configured to turn on one or more of the high-side switch and the low-side switch; and
    a first switch that is controlled to lower the reference voltage if a dead time exceeds a first threshold; and
    a second switch that is controlled to raise the reference voltage if the dead time delay signal is below a second threshold;
    wherein the dead time equals an amount of time when the high-side switch and the low-side switch are turned off.

2. The circuit according to claim 1, further comprising a first time-based current source configured to be coupled to the first input of the comparator via the first switch.

3. The circuit according to claim 2, wherein the first switch is configured to close upon determining that the dead time exceeds the first threshold, thereby decreasing the reference voltage by coupling the first time-based current source to the first input of the comparator.

4. The circuit according to claim 3, wherein the first switch is controlled by a first input signal that closes the first switch based on the dead time.

5. The circuit according to claim 4, wherein the first input signal closes the first switch based on a rate at which the first time-based current source decrements the reference voltage.

6. The circuit according to claim 2, further comprising a second time-based current source configured to be coupled to the first input of the comparator via the second switch;
    wherein the second switch is configured to close upon determining that the dead time is less than a second threshold, thereby increasing the reference voltage by coupling the second time-based current to the first input of the comparator.

7. The circuit according to claim 6, wherein the second switch is controlled by a second input signal that closes the second switch based on a rate at which the second time-based current source increments the reference voltage.

8. A device comprising:
    a power converter comprising a high-side switch and a low-side switch;
    a comparator configured to receive a reference voltage at a first input and a ramp voltage at a second output, and to output a delay signal based on a comparison of the reference voltage and the ramp voltage, said delay signal configured to turn on one or more of the high-side switch and the low-side switch; and
    a first switch that is controlled to lower the reference voltage if a dead time exceeds a first threshold; and
    a second switch that is controlled to raise the reference voltage if the dead time delay signal is below a second threshold;
    wherein the dead time equals an amount of time when the high-side switch and low-side switch are turned off.

9. The device according to claim 8, further comprising a first time-based current source configured to be coupled to the first input of the comparator via the first switch.

10. The device according to claim 9, wherein the first switch is configured to close upon determining that the dead time exceeds the first threshold, thereby decreasing the reference voltage by coupling the first time-based current source to the first input of the comparator.

11. The device according to claim 10, wherein the first switch is controlled by a first input signal that closes the first switch based on the dead time.

12. The device according to claim 11, wherein the first input signal closes the first switch based on a rate at which the first time-based current source decrements the reference voltage.

13. The device according to claim 9, further comprising a second time-based current source configured to be coupled to the first input of the comparator via the second switch;
wherein the second switch is configured to close upon determining that the dead time is less than a second threshold, thereby increasing the reference voltage by coupling the second time-based current to the first input of the comparator.

14. The device according to claim 13, wherein the second switch is controlled by a second input signal that closes the second switch based on a rate at which the second time-based current source increments the reference voltage.

15. A method of controlling a power converter having a high-side switch and a low-side switch, the method comprising:
comparing a reference voltage and a ramp voltage;
outputting a delay signal based on the comparison of the reference voltage and the ramp voltage;
turning on at least one of the high-side switch and the low-side switch based on the delay signal;
measuring a dead time, wherein said dead time equals an amount of time when the high-side switch and the low-side switch are turned off; and
controlling the reference voltage based on the measured dead time.

16. The method according to claim 15, wherein said controlling the reference voltage comprises:
determining whether the measured dead time exceeds a first threshold; and
upon determining that the measured dead time exceeds the first threshold, decreasing the reference voltage.

17. The method according to claim 15, wherein said controlling the reference voltage comprises:
determining whether the measured dead time is less than a second threshold; and
upon determining that the measured dead time is less than the second threshold, increasing the reference voltage.

* * * * *

UNITED STATES PATENT AND TRADEMARK OFFICE
CERTIFICATE OF CORRECTION

PATENT NO. : 10,199,919 B2
APPLICATION NO. : 15/960930
DATED : February 5, 2019
INVENTOR(S) : David Gammie It is certified that error appears in the above-identified patent and that said Letters Patent is hereby corrected as shown below:

In the Claims

Column 3, Line 65: Delete "output" and replace with "input"

Column 4, Line 41: Delete "output" and replace with "input"

Signed and Sealed this
Twenty-sixth Day of March, 2019

Andrei Iancu
*Director of the United States Patent and Trademark Office*